United States Patent
Geng et al.

(10) Patent No.: US 9,854,699 B2
(45) Date of Patent: Dec. 26, 2017

(54) INSERT ELEMENT FOR FRAMEWORKS

(71) Applicant: Patchbox GmbH, Vienna (AT)

(72) Inventors: Alexander Geng, Vienna (AT); Josef Hofstätter, Ennsbach (AT)

(73) Assignee: PATCHBOX GMBH, Vienna (AT)

( * ) Notice: Subject to any disclaimer, the term of this patent is extended or adjusted under 35 U.S.C. 154(b) by 0 days.

(21) Appl. No.: 15/312,551

(22) PCT Filed: May 19, 2015

(86) PCT No.: PCT/AT2015/000076
§ 371 (c)(1),
(2) Date: Nov. 18, 2016

(87) PCT Pub. No.: WO2015/176086
PCT Pub. Date: Nov. 26, 2015

(65) Prior Publication Data
US 2017/0127551 A1    May 4, 2017

(30) Foreign Application Priority Data

May 20, 2014   (AT) .................................. A 380/2014

(51) Int. Cl.
*H05K 7/14*        (2006.01)
*H04Q 1/06*        (2006.01)

(52) U.S. Cl.
CPC ............. *H05K 7/1491* (2013.01); *H04Q 1/06* (2013.01)

(58) Field of Classification Search
None
See application file for complete search history.

(56) References Cited

U.S. PATENT DOCUMENTS

| | | | | |
|---|---|---|---|---|
| 2,503,974 A | * | 4/1950 | Sparaco | B60Q 1/52 174/69 |
| 2,562,979 A | * | 8/1951 | Yingling | F21V 21/35 174/69 |
| 2,656,999 A | * | 10/1953 | Ullberg, Jr. | H02G 3/0608 193/22 |
| 3,403,578 A | * | 10/1968 | Morse | B63H 21/265 114/160 |
| 3,563,481 A | * | 2/1971 | Stahmer | B65H 75/38 242/390.6 |
| 3,598,349 A | * | 8/1971 | Drake | H02G 3/0456 174/68.3 |

(Continued)

FOREIGN PATENT DOCUMENTS

DE       1980265 U     3/1968

OTHER PUBLICATIONS

International Search Report for PCT/AT2015/000076 dated Sep. 2, 2015; English translation submitted herewith (5 Pages).

*Primary Examiner* — Timothy Thompson
*Assistant Examiner* — Muhammed Azam
(74) *Attorney, Agent, or Firm* — Fitch, Even, Tabin & Flannery, LLP

(57) ABSTRACT

An insert element for frameworks, in particular racks, for use in the information and network technology, comprises a plurality of insertion slots, wherein the insertion slots receive insertable cable storage elements each accommodating a cable, the two cable ends of which are guided to the outside via openings provided in the end face of the cable storage element and can be pulled out of the cable storage element at variable lengths.

23 Claims, 6 Drawing Sheets

(56) References Cited

U.S. PATENT DOCUMENTS

Figure 1:
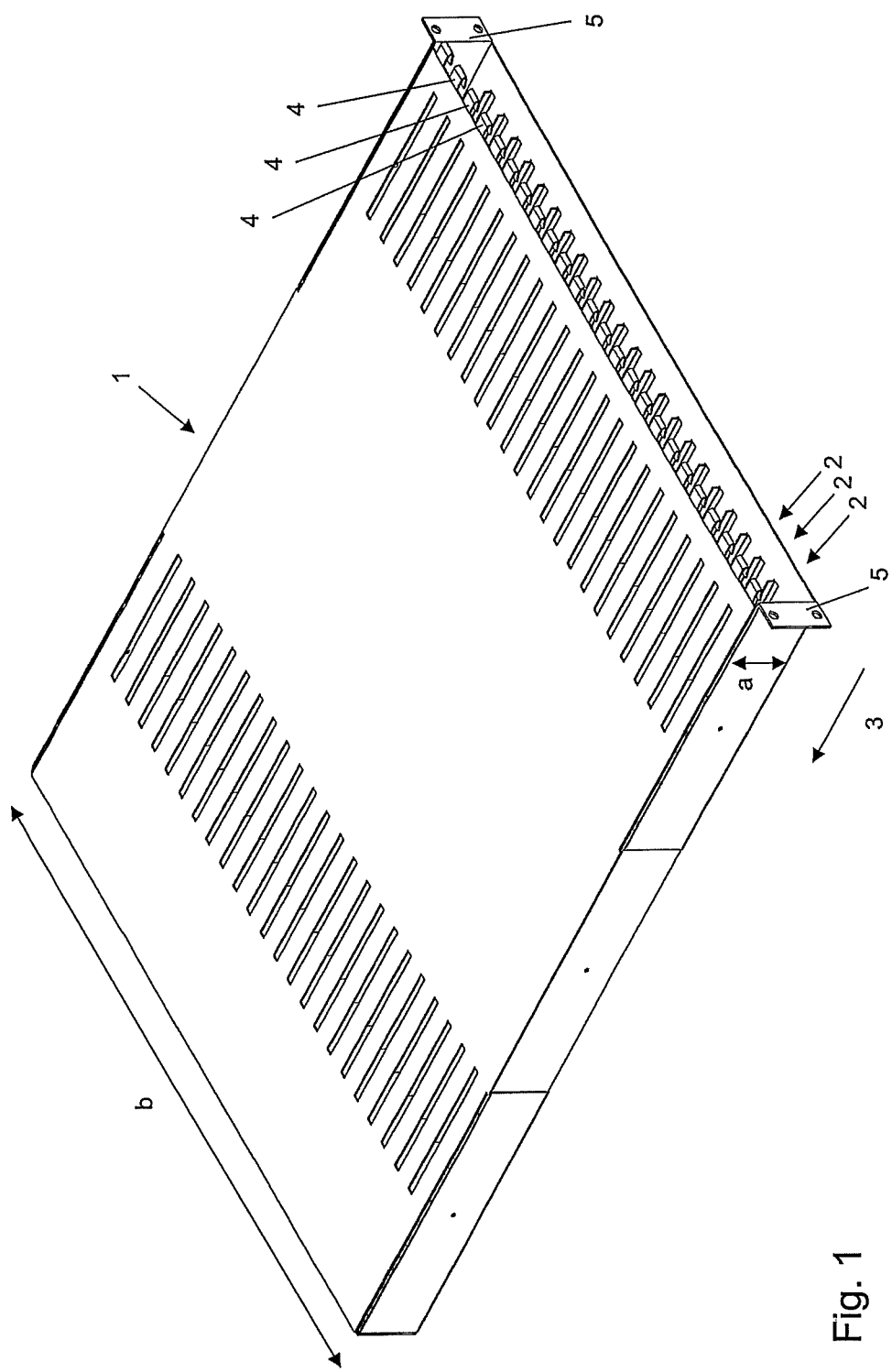

| | | | | |
|---|---|---|---|---|
| 3,791,613 A * | 2/1974 | Nollen | H02G 3/0456 | |
| | | | 174/68.3 | |
| 3,796,923 A * | 3/1974 | Johansson | H04Q 1/16 | |
| | | | 174/72 A | |
| 4,174,816 A * | 11/1979 | Olson | B65H 75/36 | |
| | | | 242/272 | |
| 4,432,519 A * | 2/1984 | Wright | H02G 3/0456 | |
| | | | 174/68.3 | |
| 5,639,048 A * | 6/1997 | Bartholomew | F16L 3/26 | |
| | | | 248/49 | |
| 6,143,985 A * | 11/2000 | Knapp | H02G 11/00 | |
| | | | 174/69 | |
| 6,313,405 B1 * | 11/2001 | Rinderer | H02G 3/0456 | |
| | | | 174/68.3 | |
| 6,408,563 B1 * | 6/2002 | Van Scoy | A01K 87/00 | |
| | | | 43/25.2 | |
| 6,483,033 B1 * | 11/2002 | Simoes | G02B 6/4457 | |
| | | | 174/135 | |
| 6,484,958 B1 * | 11/2002 | Xue | B65H 75/4434 | |
| | | | 242/378.1 | |
| 6,626,389 B2 * | 9/2003 | Kagel | A45F 5/004 | |
| | | | 242/371 | |
| 6,643,141 B2 * | 11/2003 | Kaetsu | H04Q 1/10 | |
| | | | 174/255 | |
| 6,963,495 B1 * | 11/2005 | Carullo | H05K 7/1425 | |
| | | | 174/382 | |
| 7,042,737 B1 * | 5/2006 | Woolsey | H05K 7/1445 | |
| | | | 174/384 | |
| 7,229,050 B2 * | 6/2007 | Schloss | H05K 7/1497 | |
| | | | 211/26 | |
| 7,230,833 B1 * | 6/2007 | Sickels | B60R 16/0239 | |
| | | | 361/740 | |
| 7,594,909 B2 * | 9/2009 | Mogensen | B65H 75/4452 | |
| | | | 604/174 | |
| 7,889,508 B2 * | 2/2011 | Sato | H05K 7/1461 | |
| | | | 361/741 | |
| 8,193,448 B2 * | 6/2012 | Syed | G06F 1/18 | |
| | | | 174/68.1 | |
| 9,272,876 B2 * | 3/2016 | Draganovic | B65H 75/4486 | |
| 9,327,938 B2 * | 5/2016 | Wilson | B65H 75/4402 | |
| 2003/0059192 A1 * | 3/2003 | Johnson | B65H 75/22 | |
| | | | 385/135 | |
| 2006/0016614 A1 * | 1/2006 | Yokoyama | H02G 11/00 | |
| | | | 174/69 | |
| 2006/0273211 A1 * | 12/2006 | Langberg | B65H 75/368 | |
| | | | 242/388.91 | |
| 2010/0172083 A1 | 7/2010 | Randall et al. | | |
| 2013/0306780 A1 | 11/2013 | Marcouiller et al. | | |
| 2017/0127551 A1 * | 5/2017 | Geng | H04Q 1/06 | |

* cited by examiner

INSERT ELEMENT FOR FRAMEWORKS

CROSS-REFERENCE TO RELATED APPLICATIONS

This application is a U.S. national phase application filed under 35 U.S.C. §371 of International Application No. PCT/AT2015/000076, filed May 19, 2015, designating the United States, and claims priority from Austrian Patent Application No. A 380/2014, filed May 20, 2014, and the complete disclosures of which applications are hereby incorporated herein by reference in their entirety for all purposes.

FIELD

The invention relates to an insert element for frameworks, in particular racks, for use in the information and network technology, comprising a plurality of insertion slots. The invention further relates to a cable storage element for insertion into an insertion slot of the insert element.

BACKGROUND

In the information and network technology, it is frequently necessary to stow a plurality of network components and computers in a rack and interconnect the same via cables, in particular network cables. During the operation of a datacenter, yet also in the event, laboratory and automatic-control technologies, the term "rack" stands for a frame for electric appliances with a standard width of 19 inch, wherein the individual appliances (so-called insert elements) to be mounted in the rack have a front plate width of exactly 48.26 cm (19"). The insert elements are each fastened by four screws in the series of holes of vertically extending sheet metal brackets near the front edges of the rack.

The mutual cabling of the individual insert elements is very complex. Where cables having standard cable lengths are used, there is the problem of frequently having an excess length, which causes entanglement resulting in confusion and difficult handling when reconnecting the different cables of the network

SUMMARY

The present invention, therefore, aims to avoid the above-described drawbacks.

To solve this object, the insert element for frameworks, in particular racks, for use in the information and network technology, according to the invention comprises a plurality of insertion slots, wherein the insertion slots receive insertable cable storage elements each accommodating a cable, the two cable ends of which are guided to the outside via openings provided in the end face of the cable storage element and which can be pulled out of the cable storage element at variable lengths.

This ensures a proper and space-saving storage of cables within the rack and variability as to the lengths of the respectively required cable connections. In that the two cable ends can be led outwardly on the end face of the cable storage element at variable lengths, the respectively required cable length can be pulled out from the cable storage so as to enable the connection both between two closely adjacent insert elements or components and between insert elements or components plugged into the rack at more remote mutual distances. Annoying cable excess lengths will thus be avoided.

It is particularly advantageous if the two cable ends can be pulled out of the cable storage independently of each other.

The insert element according to the invention is preferably further developed to the effect that the two cable ends can each be independently pulled out of the cable storage element against the force of a spring. Thus, if only one of the cable ends within the rack has to be reconnected, this will be possible without having to disconnect the connections on the other end of the cable. This helps to avoid complex reconnection and rearrangement of the cable connections. It will, in particular, be avoided to have to exchange a cable of a defined length for a shorter or a longer cable.

According to a further embodiment of the invention, the insert element for frameworks is configured to comprise a plurality of insertion slots receiving insertable cable storage elements each accommodating a cable, the first cable end of which is guided to the outside via an opening provided in one end face of the cable storage element and can be pulled out of the cable storage element at variable length and the second cable end of which is guided to the outside via an opening provided in the second, oppositely located end face of the cable storage element.

This embodiment of the invention ensures substantial space-saving within the server cabinet, since the cable end leaving the cable storage element on the end face nearer to the rear wall of the server cabinet can be fixedly connected to a patch field provided on the inner side of the rear wall of the server cabinet, and hence no separate patch field will be required in a further insertion slot of the insert element.

Moreover, a substantially longer cable can be accommodated in the cable storage element, since the cable in this embodiment can be guided a further time, i.e. altogether twice, around a deflection element provided in the cable storage element.

In a preferred manner, the said insert element is further developed to the effect that the one cable end can be pulled out of the cable storage element independently of the second cable end against the force of a spring.

The freely moving cable end can thus be reconnected within the rack without having to disconnect the connections on the other cable end. This helps to avoid complex reconnection and rearrangement of the cable connections. It will, in particular, be avoided to have to exchange a cable of a defined length for a shorter or a longer cable.

In an advantageous manner, the insert element according to the invention is further developed to the effect that the cable in the cable storage element is guided around at least one roller displaceable against the force of a spring element and preferably fastened to the spring element. The spring element will thus tension the cable accommodated in the cable storage element. The cable to be accommodated is guided around the roller fastened to the spring element, and, due to the spring element, the roller can be moved within the cable storage element in the direction of the end face of the cable storage element by pulling on the respective cable ends and is again pulled back into the cable storage element by the force of a spring exerted on the roller by the spring element after disconnecting the connection. The spring element can, for instance, be configured as a coil spring, a torsion spring, a bending spring, e.g. a spiral leaf spring, or the like.

The insert element according to the invention, in particular, can be further developed to the effect that the cable, on its end located opposite the roller, is guided around a deflection element, said deflection element being preferably configured as a stationary element, in particular a stationary roller. By guiding the cable twice around the roller and the deflection element, a large amount of cable can be accommodated in a comparatively small storage element, and the spring element enables the variable extraction and retraction of one or both cable ends. The deflection element thus fulfills a double function. On the one hand, it serves to deflect the cable to be accommodated in the cable storage element—i.e. guide it around the deflection element and, on the other hand, it serves to respectively pull the upper and the lower ends of the cable out of the cable storage element each above and below the deflection element. In a preferred manner, the deflection element is rotationally mounted.

The insert element according to the invention is preferably further developed to the effect that the cable storage element comprises a housing enclosing a parallelepipedic storage space and the cable is accommodated in the storage space. Due to the fact that both the insert element and the cable storage element are formed as parallelepipeds, an extremely space-saving storage option is provided for the respective cable, while the space within the insert element is, at the same time, optimally utilized.

In an advantageous manner, the insert element according to the invention is further developed to the effect that the insert element has a height of 1.75 inch or 3.5 inch, and a width of 19 inch. These dimensions correspond to the slots provided in a commercially available rack, thus enabling a problem-free accommodation of the insert elements provided by the invention in already existing racks. The insert element according to the invention thus does not require a separate rack specifically designed therefor.

The insert element according to the invention can, in particular, be further developed to the effect that the insert element comprises at least 3, preferably 5 to 48, in particular 24, insertion slots. It will each depend on the thickness or length of the cable to be accommodated. With thin and short cables, the cable storage element may be less wide, thus possibly requiring an insert element to have a larger number of insertion slots. With thicker and longer cables, wider cable storage elements are necessary, which in turn requires insert elements to have less insertion slots. Moreover, a combination of differently wide insertion slots within an insert element is also conceivable.

The insert element according to the invention is preferably further developed to the effect that the roller, which is displaceable against the force of the spring element and, in particular, fastened to the spring element, comprises at least one partition element preferably disposed in the middle of the roller. The partition element functions as a partition wall between the cable portions guided around the roller. This enables a problem-free extraction and retraction of the cable ends, since the different cable portions will not be able to overlap due to said partition element.

In an advantageous manner, the insert element according to the invention is further developed to the effect that means for braking the restoring movement of the roller are provided. In addition, the insert element according to the invention may, in particular, be further developed to the effect that the roller slippingly interacts with the housing wall of the storage space of the cable storage element. The height of the partition element can thus, for instance, be chosen such that the obtained diameter of the roller is only slightly smaller than the height of the housing of the cable storage element so as to cause the roller to slowly return when releasing one of the cable ends due to the spring force and thus avoiding any uncontrolled and jerky retraction of the cable.

It may, furthermore, be provided that the cable storage element comprises a roller system with several, in particular two, resiliently held rollers. This facilitates the independent extraction of the two resiliently held rollers along with the cables surrounding them.

In a particularly preferred manner, the insert element according to the invention is further developed to the effect that a partition wall is each provided between two resiliently held rollers of the roller system. The insert element according to the invention in this respect is preferably further developed to the effect that the partition wall subdivides the storage space into two chambers, and the first resiliently held roller is guided in the first chamber and the second resiliently held roller is guided in the second chamber. This enables the unimpeded movement of the respective roller without interference by the respective other roller.

The insert element according to the invention may, in particular, be further developed to the effect that the cable is a ribbon cable, in particular a coaxial cable or a twisted-pair cable, or a round cable. The cable can, moreover, be a network cable, an audio cable, a fiber optic cable, or a telephone cable.

In an advantageous manner, the insert element according to the invention is further developed to the effect that the cable storage element is able to accommodate up to 2.4 m cable. The accommodation of 2.4 m cable is, in particular, possible in a cable storage element with a depth of 60 cm. In an analogous manner, 1.2 m cable can be accommodated by a cable storage element with a depth of 30 cm, 4 m cable by a cable storage element with a depth of 100 cm, and 4.8 m cable by a cable storage element with a depth of 120 cm.

The invention further relates to a cable storage element for insertion into an insertion slot of an insert element, comprising an elongate housing defining a parallelepipedic storage space, wherein a cable is accommodated in the storage space, the two cable ends of which can be guided to the outside via openings provided in the end face of the cable storage element and can be pulled out of the cable storage element at variable lengths. An alternative embodiment provides that the first cable end is guided to the outside via an opening provided in one end face of the cable storage element and can be pulled out of the cable storage element at variable length, and the second cable end is guided to the outside via an opening provided in the second, oppositely located end face of the cable storage element.

Preferred further developments of the cable storage element will be apparent from the dependent claims and have already been discussed in the context of the insert element according to the invention.

BRIEF DESCRIPTIONS OF THE DRAWINGS

In the following, aspects of the invention will be explained in more detail by way of exemplary embodiments schematically illustrated in the drawings.

Figure 2:
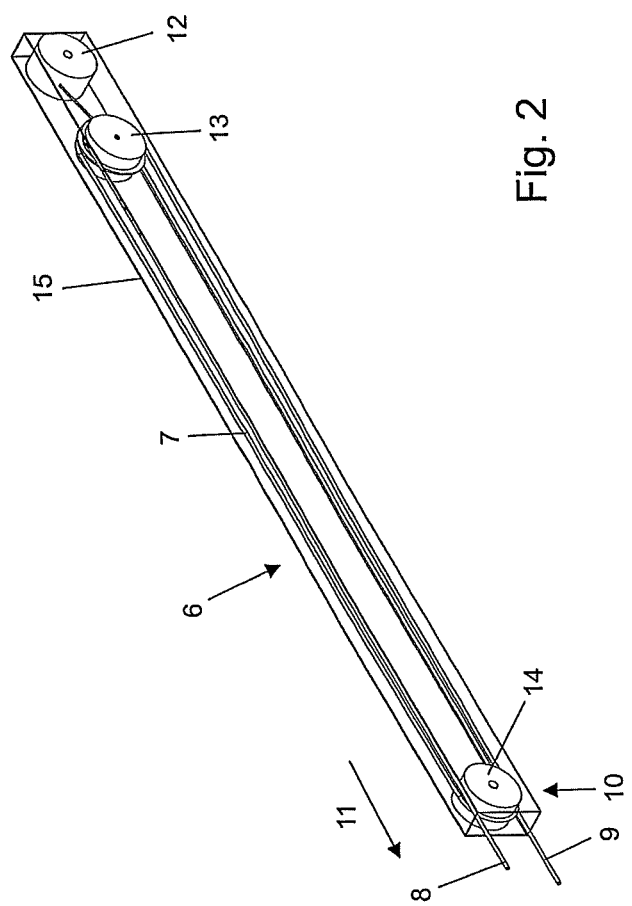
Figure 3:
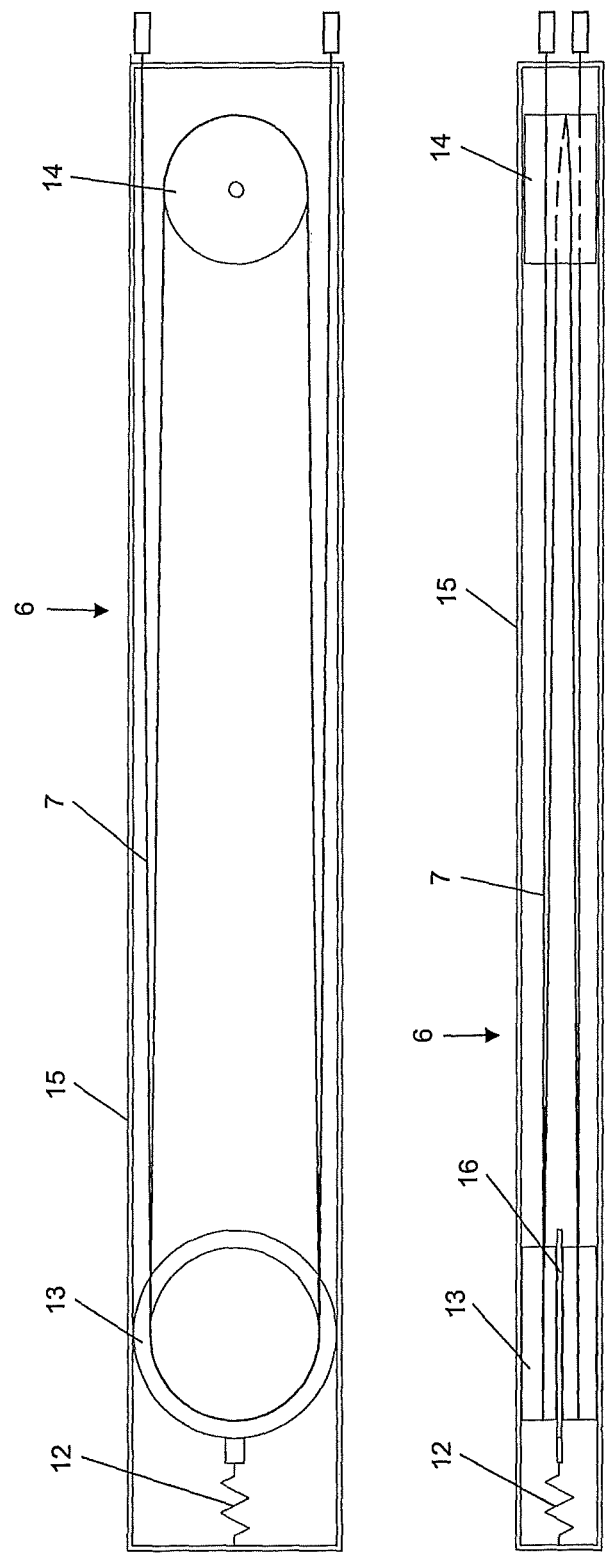
Figure 4:
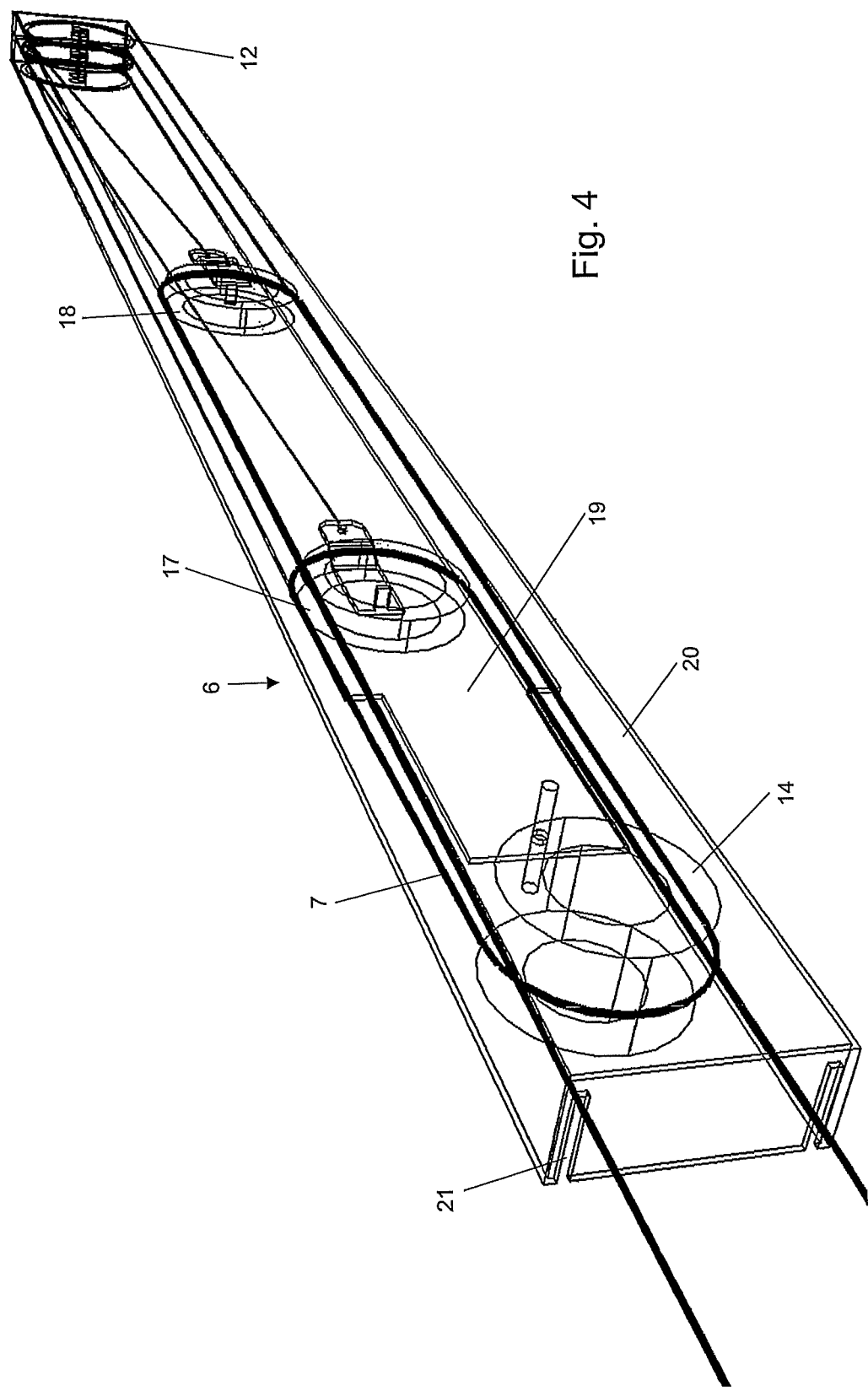
Figure 5:
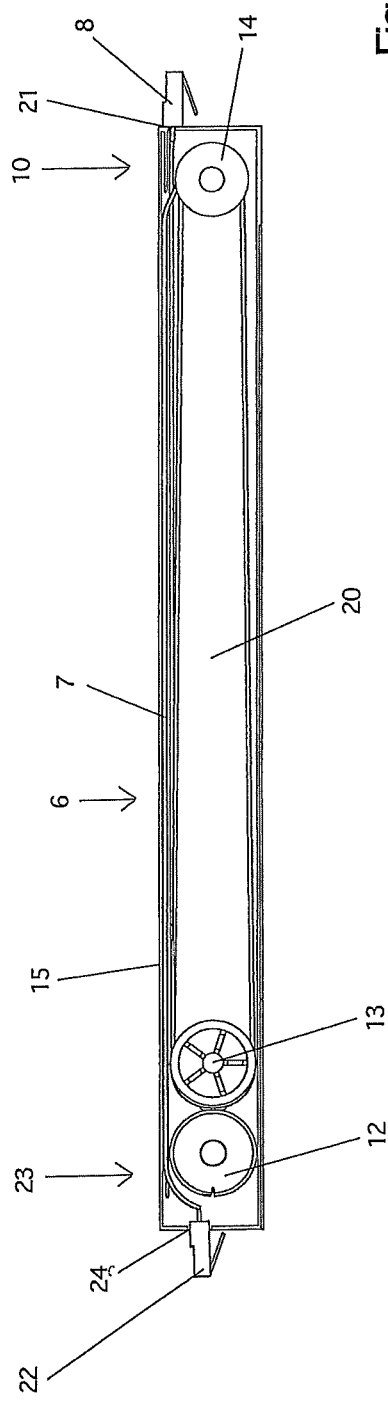
Figure 6:
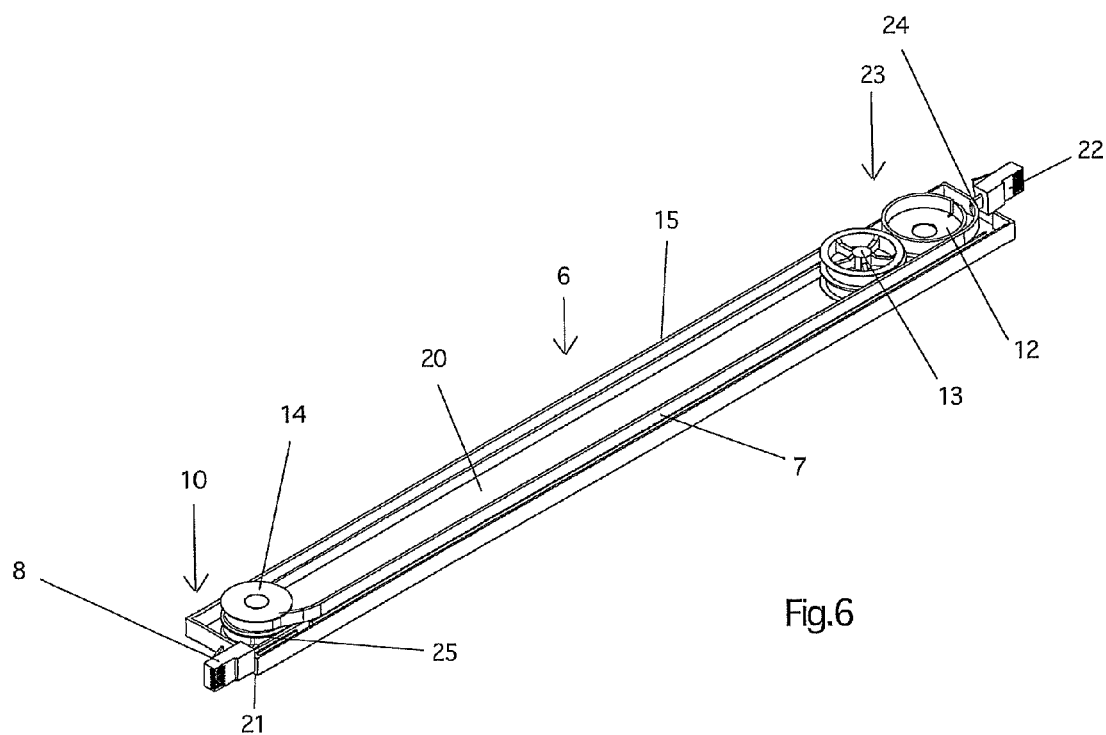

FIG. 1 illustrates an insert element 1 for frameworks. FIG. 2 depicts a first embodiment of a cable storage element. FIG. 3 is a top view of the first embodiment of the cable storage element of FIG. 2. FIG. 4 depicts a second embodiment of the cable storage element. FIG. 5 depicts a configuration of the cable storage element according to a further aspect. FIG. 6 is a perspective view of the cable storage element depicted in FIG. 5, with the housing open.

DETAILED DESCRIPTION

FIG. 1 illustrates an insert element 1 for frameworks, which comprises 24 adjacently arranged insertion slots 2 for accommodating cable storage elements insertable into the insertion slots 2. The individual insertion slots are each mutually separated by guide elements, in particular partition ribs, extending in the longitudinal direction. The insert element comprises a parallelepipedic housing with a height a of preferably 1.75 inch or 3.5 inch and a width b of preferably 19 inch. The cable storage elements are inserted into the insertion slots 2 of the insert element 1 in the sense of arrow 3 and fixed within the insert element 1 by engaging the clips 4 on the head-side end of the cable storage element. The insert element 1 can be screwed with the framework by connecting elements 5 provided laterally on both sides of the insert element 1.

FIG. 2 depicts a first embodiment of a cable storage element 6 according to the invention, which can be inserted into the insert element illustrated in FIG. 1. The cable storage element 6 comprises a parallelepipedic housing 15 whose width and height substantially correspond to the width and height of the insertion slots 2. The housing accommodates a cable 7 whose two cable ends 8, 9 are guided to the outside via openings (not illustrated here) provided in the end face 10 of the cable storage element 6 in the sense of arrow 11 and can be pulled out of the cable storage element 6 at variable lengths.

It would, for instance, be conceivable that said openings taper narrowly on both sides and the cables can thus be clamped, and hence fixed, in the laterally narrower regions of the openings after having been pulled out.

It is further apparent from FIG. 2 that the cable storage element 6 comprises a spring element 12, a roller 13 fastened to the spring element 12, and a roller-shaped deflection element 14. The cable 7 accommodated in the cable storage element 6 is guided around the roller 13 fastened to the spring element 12 and is further guided around the deflection element 14 on the end opposite the spring element 12. In doing so, the cable 7 is introduced into the parallelepipedic housing 15 on the end face 10 of the cable storage element 6, guided in the direction of the roller 13, guided a first time around the roller 13, and deflected by 180°. After this, the cable 7 is returned to the end face 10 of the cable storage element 6, where it is guided around the deflection element 14, again deflected by 180°, and then guided a second time in the direction of the roller 13. There, the cable 7 is guided around the roller 13 a further time, deflected by 180°, and again returned to the end face 10 of the cable storage element 6, where it leaves the parallelepipedic housing 15.

Due to the pull on the two cable ends 8, 9 along arrow 11, the cable ends 8, 9 can each be pulled out of the cable storage element 6 independently of each other, against the spring force exerted by the spring element 12.

The cable 7 is thus guided both around the roller 13 and around the deflection element 14 so as to enable twice the amount of cable 7 to be accommodated in the cable storage element 6.

It would, furthermore, be conceivable that the cable is guided around the roller 13 and the deflection element 14 more than twice so as to enable the stowage of even longer cables 7 in the cable storage element 6.

FIG. 3 is a top view according to the first embodiment of the cable storage element 6 of FIG. 2. The roller 13 fastened to the spring element 12 comprises a partition element 16 disposed in the middle of the roller 13, which firstly serves to guide the cable 7 properly also after having been wound around the roller and secondly functions as a means for braking the return movement of the roller 13, since the height of the partition element 16 is chosen such that the partition element 16 slippingly interacts with the housing wall 15 of the storage space of the cable storage element 6.

FIG. 4, by way of a further embodiment of the present invention, illustrates that the insert element 6 may comprise a roller system composed of two resiliently held rollers 17, 18. In this case, a partition wall 19 is provided between the two resiliently held rollers 17, 18 of the roller system. The partition wall 19 subdivides the storage space 20 into two chambers, the first resiliently held roller 17 being guided in the first chamber and the second resiliently held roller 18 being guided in the second chamber.

In addition, the openings 21 via which the cable 7 leaves the storage space 20 of the cable storage element 6 above and below the deflection element 14, which are not illustrated in FIG. 2, are depicted in FIG. 4.

A further embodiment, which differs from the previously described embodiment merely in that the first cable end of the cable present in the cable storage element is guided to the outside at variable length on the one end face of the cable storage element and the second cable end is guided to the outside on the second end face of the cable storage element, is illustrated in FIGS. 5 and 6. Apart from that, the two embodiments do not have substantial structural differences and the reference numbers have been largely retained.

FIG. 5 depicts a cable storage element 6, which comprises an elongate housing 15 enclosing a parallelepipedic storage space 20, wherein a cable 7 is accommodated in the storage space 20, the first end 8 of which cable is guided to the outside via an opening 21 formed in the first end face 10 of the cable storage element 6 and can be pulled out of the cable storage element 6 at variable length, and the second end 22 of which cable is guided to the outside via an opening 24 formed in the second end face 23 of the cable storage element 6. The cable end 22 is subsequently connected fixedly, i.e. unchangeably in its length, to a patch field (not illustrated) provided on the inner side of the rear wall of the server cabinet.

From FIG. 5, it can, moreover, be taken that the cable 7 in the storage space 20 is guided twice around the roller fastened to the spring element 12 and twice around the deflection element 14. The cable 7 accommodated in the cable storage element 6 is guided around the roller 13 fastened to the spring element 12 and, furthermore, is guided on the end opposite the spring element 12 around the deflection element 14. The cable 7 is thereby introduced into the cable storage element 6 on the end face 10 of the cable storage element 6, guided in the direction of the roller 13, guided a first time around the roller 13, and deflected by 180°. After this, the cable 7 is guided back to the end face 10 of the cable storage element 6, where it is guided around the deflection element 14, again deflected by 180°, and then guided a second time in the direction of the roller 13. There, the cable 7 is guided around the roller 13 a further time, deflected by 180°, and again returned to the end face 10 of the cable storage element 6, where it is again guided around the deflection element 14 and guided a third time in the direction of the roller 13, where it finally leaves the cable storage element 6 via the opening 24 formed in the second end face 23 of the cable storage element 6.

FIG. 6 is a perspective view of the cable storage element depicted in FIG. 5, with the housing open. Since the cable 7—as mentioned before—is guided twice around the deflection element 14, the latter comprises a partition element 25 disposed centrally on the deflection element 14 and serving as a partition wall between the cable portions guided around the deflection element 14. Thus, the problem-free pulling-in and pulling-out of the cable end 8 is enabled, because the different cable portions will not be able to overlap due to said partition element.

The invention claimed is:

1. An insert element for a frameworks configured for use in the information and network technology, the insert element comprising a plurality of insertion slots, and the insert element having insertable cable storage elements, characterized in that the insertion slots receive insertable cable storage elements each accommodating a cable having two cable ends, openings provided in the end face of the cable storage element wherein the cable ends are guided to the openings and can be pulled out of the cable storage element at variable lengths, wherein the cable in the cable storage element is guided around at least one roller displaceable against the force of a spring element and, on its end located opposite the roller, the cable is guided around a deflection element, said deflection element optionally being configured as a stationary element, and wherein the two cable ends can each be pulled out of the cable storage element independently of each other against the force of a spring, wherein the roller, which is displaceable against the force of the spring element and optionally fastened to the spring element, comprises at least one partition element disposed in the roller.

2. An insert element fora frameworks configured for use in the information and network technology, the insert element comprising a plurality of insertion slots, and the insert element having insertable cable storage elements, characterized in that the insertion slots receive insertable cable storage elements each accommodating a cable having a first cable end and a second cable end, the first cable end of which is guided to the outside via an opening provided in one end face of the cable storage element and can be pulled out of the cable storage element at variable length and the second cable end of which is guided to the outside via an opening provided in the second, oppositely located end face of the cable storage element, wherein the cable in the cable storage element is guided around at least one roller displaceable against the force of a spring element and, and on its end located opposite the roller is guided around a deflection element, said deflection element optionally being configured as a stationary element, and wherein the two cable ends can each be pulled out of the cable storage element independently of each other against the force of a spring, wherein the roller, which is displaceable against the force of the spring element and optionally fastened to the spring element, comprises at least one partition element disposed in the roller.

3. An insertable cable storage element configured for insertion into an insertion slot that is configured to receive the insertable cable storage element and that is provided in an insert element, said insertable cable storage element comprising
   an elongate housing defining a parallelepipedic storage space,
   a cable is accommodated in the storage space, the cable having two cable ends that are guided to the outside via respective openings provided in an end face of the cable storage element and can be pulled out of the cable storage element at variable lengths,
   wherein the cable in the cable storage element is guided around at least one roller displaceable against the force of a spring element at an end of the housing and, on its end oppiste the roller, the cable is guided around a deflection element, said deflection element optionally configured as a stationary element, and wherein the two cable ends can each be pulled out of the cable storage element independently of each other against the force of a spring,
   wherein the roller, which is displaceable against the force of the spring element, comprises at least one partition element disposed in the roller.

4. An insert element according to claim 2, characterized in that the one cable end can be pulled out of the cable storage element independently of the second cable end against the force of a spring.

5. An insertable cable storage element configured for insertion into an insertion slot that is configured to receive the inserteable cable storage element and that is provided in an insert element, said insertable cable storage element comprising
   an elongate housing defining a parallelepipedic storage space,
   a cable accommodated in the storage space, the cable having a first cable end guided to the outside via an openings provided in one face of the cable storage element and can be pulled out of the cable storage element at a variable length, and having a second cable end guided to the outside via an opening provided in a second, oppositely located end face of the cable storage element,
   wherein the cable in the cable storage element is guided around at least one roller displaceable against the force of a spring element, and, in the cable storage element, on its end located opposite the roller, the cable is guided around a deflection element,
   said deflection element optionally configured as a stationary element, and
   wherein the two cable ends can each be pulled out of the cable storage element independently of each other against the force of a spring, wherein the roller, which is displaceable against the force of the spring element, comprises at least one partition element disposed in the roller.

6. A cable storage element according to claim 5, characterized in that one cable end can be pulled out of the cable storage element independently of the second cable end against the force of a spring.

7. An insert element according to claim 1, characterized in that the cable storage element comprises a housing enclosing a parallelepipedic storage space and the cable is accommodated in the storage space.

8. An insert element according to claim 7, characterized in that the insert element has a height of 1.75 inches or 3.5 inches, and a width of 19 inches.

9. An insert element according to claim 8, characterized in that the insert element comprises (i) at least 3 insertion slots, (ii) 5 to 48 insertion slots, or (iii) 24 insertion slots.

10. A cable storage element according to claim 3, characterized in that the cable storage element further comprises means for braking the restoring movement of the roller.

11. An insert element according to claim 1, characterized in that said cable storage element further comprises means for braking the restoring movement of the roller.

12. An insert element according to claim 7, characterized in that the roller slippingly interacts with the housing wall of the storage space of the cable storage element.

13. An insert element according to claim 1, characterized in that the cable storage element comprises a roller system with resiliently held rollers.

14. An insert element according to claim 13, characterized in that the roller system comprises two resiliently held rollers, and a partition wall is provided between the two resiliently held rollers of the roller system.

15. An insert element according to claim 14, characterized in that the cable storage element has a housing that defines an insert storage space, the partition wall subdivides the storage space into two chambers, and wherein one resiliently held roller is guided in the first chamber and the other resiliently held roller is guided in the second chamber.

16. An insert element according to claim 1, characterized in that the cable is a ribbon cable comprising a coaxial cable, or a twisted-pair cable, or a round cable.

17. An insert element according to claim 1, characterized in that the cable storage element is able to accommodate up to 2.4 m cable.

18. A cable storage element according to claim 3, characterized in that the roller slippingly interacts with the housing wall of the storage space of the cable storage element.

19. A cable storage element according to claim 3, characterized in that the cable storage element comprises a roller system with resiliently held rollers.

20. A cable storage element according to claim 19, characterized in that the roller system comprises two resiliently held rollers, and a partition wall is provided between the two resiliently held rollers of the roller system.

21. A cable storage element according to claim 20, characterized in that the partition wall subdivides the storage space into two chambers, and one resiliently held roller is guided in a first chamber and the other resiliently held roller is guided in a second chamber.

22. A cable storage element according to 3, characterized in that the cable is a ribbon cable comprising a coaxial cable, or a twisted-pair cable, or a round cable.

23. A cable storage element according to claim 3, characterized in that the cable storage element is configured to accommodate up to 2.4 m cable.

\* \* \* \* \*